(12) United States Patent
Ibrahim et al.

(10) Patent No.: US 8,983,418 B2
(45) Date of Patent: Mar. 17, 2015

(54) MULTI-STAGE GAIN CONTROL IN RECEIVERS AND OTHER CIRCUITS

(75) Inventors: Amir Ibrahim, Newport Beach, CA (US); Henrik Tholstrup Jensen, Long Beach, CA (US); Shahla Khorram, Irvine, CA (US); Aminghasem Safarian, Tustin, CA (US); Seema Anand, Rancho Palos Verdes, CA (US)

(73) Assignee: Broadcom Corporation, Irvine, CA (US)

(*) Notice: Subject to any disclaimer, the term of this patent is extended or adjusted under 35 U.S.C. 154(b) by 9 days.

(21) Appl. No.: 13/164,739

(22) Filed: Jun. 20, 2011

(65) Prior Publication Data

US 2012/0319774 A1    Dec. 20, 2012

(51) Int. Cl.
*H04B 1/06* (2006.01)
*H03G 3/30* (2006.01)
*H04B 1/28* (2006.01)
*H03D 3/00* (2006.01)

(52) U.S. Cl.
CPC ............... *H03G 3/3068* (2013.01); *H04B 1/28* (2013.01); *H03D 3/009* (2013.01)
USPC ................. 455/245.1; 455/245.2; 455/250.1; 455/251.1

(58) Field of Classification Search
CPC ......... H03G 3/3068; H03D 3/009; H04B 1/28
USPC .......... 455/232.1, 234.1, 245.1, 245.2, 250.1, 455/251.1, 253.2
See application file for complete search history.

(56) References Cited

U.S. PATENT DOCUMENTS

| | | | | |
|---|---|---|---|---|
| 6,044,112 A * | 3/2000 | Koslov | ........................ | 375/235 |
| 6,418,301 B1 * | 7/2002 | Le et al. | ........................ | 455/73 |
| 6,574,292 B2 * | 6/2003 | Heinonen et al. | ............ | 375/345 |
| 6,625,433 B1 * | 9/2003 | Poirier et al. | ............. | 455/232.1 |
| 6,950,641 B2 * | 9/2005 | Gu | ............................... | 455/241.1 |
| 6,993,291 B2 * | 1/2006 | Parssinen et al. | .......... | 455/67.11 |
| 7,076,225 B2 * | 7/2006 | Li et al. | ..................... | 455/245.1 |
| 7,299,021 B2 * | 11/2007 | P rssinen et al. | ........... | 455/226.1 |
| 7,639,998 B1 * | 12/2009 | Halvorson | ................ | 455/251.1 |
| 7,912,437 B2 * | 3/2011 | Rahman et al. | .............. | 455/296 |
| 7,979,041 B1 * | 7/2011 | Zortea et al. | ............... | 455/232.1 |
| 2002/0160734 A1 * | 10/2002 | Li et al. | ..................... | 455/245.1 |
| 2003/0100286 A1 * | 5/2003 | Severson et al. | ............. | 455/324 |
| 2003/0162518 A1 * | 8/2003 | Baldwin et al. | ............. | 455/253.2 |
| 2005/0227642 A1 * | 10/2005 | Jensen | ...................... | 455/127.1 |
| 2007/0127599 A1 * | 6/2007 | Song et al. | .................... | 375/326 |
| 2008/0018508 A1 * | 1/2008 | Filipovic et al. | ............. | 341/118 |
| 2009/0156148 A1 * | 6/2009 | Lee et al. | .................... | 455/226.2 |

\* cited by examiner

Primary Examiner — Duc M Nguyen
(74) Attorney, Agent, or Firm — Oblon, McClelland, Maier & Neustadt, L.L.P.

(57) ABSTRACT

Techniques and devices are disclosed to provide multi-stage gain control in circuits or devices having two or more stages of signal amplification. A circuit with multi-stage gain control can include amplification stages coupled to receive an input signal and to produce an amplified output signal. Each amplification stage includes an amplifier that is adjustable in gain and a signal detector that is coupled to measure an output signal of the amplifier and to produce a detector signal indicative of a signal strength of the output signal of the amplifier. A gain control circuit is coupled to receive detector signals from the signal detectors in the amplification stages, respectively, and to control gains of the amplifiers of the amplification stages based on respective received detector signals, respectively.

21 Claims, 5 Drawing Sheets

MULTI-STAGE GAIN CONTROL IN RECEIVERS AND OTHER CIRCUITS

TECHNICAL FIELD

This patent document relates to gain control in various circuits, including receivers and transceivers for wireless communications and radio broadcast.

BACKGROUND

Many electronic circuits include one or more signal amplifiers to amplify signals. A radio receiver, for example, includes an antenna for receiving a radio signal from the air and amplifies the received radio signal in processing the radio signal to improve the radio reception performance. The signal strength of the received radio signal may fluctuate or vary depending on the radio transmission and reception condition of the radio receiver. A gain control circuit can be provided to automatically regulate the gain of an amplifier. Similarly, gain control can be implemented in other circuits such as the receiver or transceiver in wireless communication devices.

DETAILED DESCRIPTION

Figure 1:
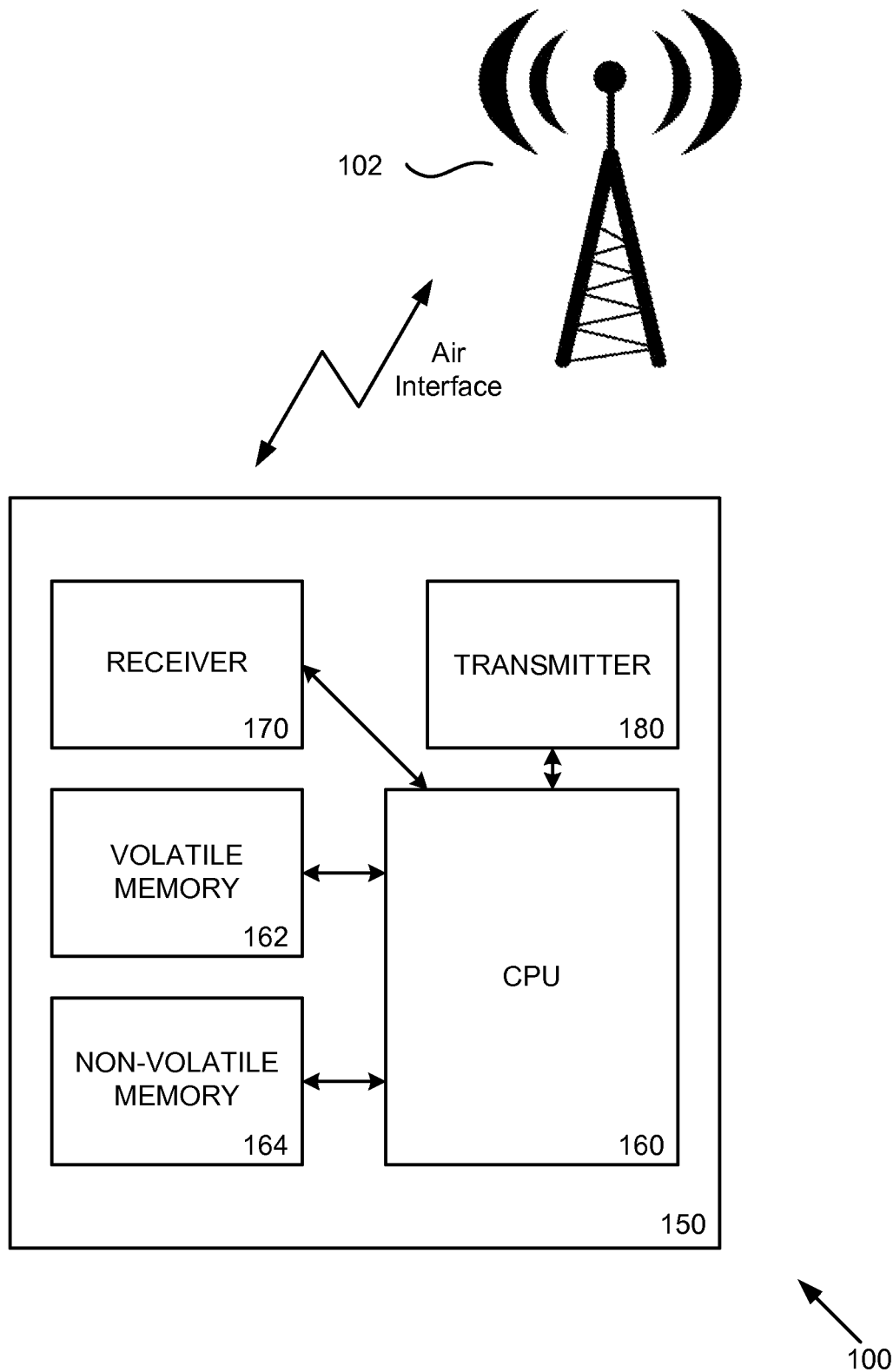
FIG. 1 shows an example of a communication system that implements a multi-stage gain control.

Circuits and devices described in this document use two or more signal amplification stages and a multi-stage gain control circuit for controlling the amplification stages. The described circuits or devices can be implemented in various applications, including receivers or transceivers for wireless communications and radio broadcast applications.

The described multi-stage gain control can be used for communication applications. Communication systems such as national and/or international cellular telephone systems, the Internet, and point-to-point in-home wireless networks supported wireless communication between wireless communication devices. A communication system may operate based on one or more communication standards, including, but not limited to, IEEE 802.11, Bluetooth, advanced mobile phone services (AMPS), digital AMPS, global system for mobile communications (GSM), Long-Term Evolution (LTE), Evolved High-Speed Packet Access (HSPA+), Code division Multiple Access (CDMA) technologies (e.g., CDMA2000 1x, and High Rate Packet Data (HRPD)), Wideband CDMA (WCDMA) technologies, WiMAX (Worldwide Interoperability for Microwave Access), local multi-point distribution systems (LMDS), multi-channel-multi-point distribution systems (MMDS), others.

A wireless communication device, such as a cellular telephone, two-way radio, personal digital assistant (PDA), personal computer (PC), laptop computer, home entertainment equipment, communicates directly or indirectly with other wireless communication devices. For direct communications or as point-to-point communications, the participating wireless communication devices tune their receivers and transmitters to the same channel, or channels, (e.g., one or more of the plurality of radio frequency (RF) carriers of the wireless communication system) and communicate over that channel(s). For indirect wireless communications, each wireless communication device communicates with an associated base station (e.g., for cellular services) and/or an associated access point (e.g., for an in-home or in-building wireless network) via one or more assigned channels. To complete a communication connection between the wireless communication devices, the associated base stations and/or associated access points communicate with each other via a system controller, via the public switch telephone network, via the internet, and/or via some other wide area network.

A wireless communication device for bidirectional wireless communications can include a built-in radio transceiver (i.e., receiver and transmitter) or is coupled to an associated radio transceiver (e.g., a station for in-home and/or in-building wireless communication networks, RF modem, etc.). A transmitter converts data into RF signals by modulating the data in accordance with the particular wireless communication standard to produce baseband signals and mixes the baseband signal with a local oscillation in one or more intermediate frequency stages to produce the RF signals. The radio receiver may include an antenna section, a filtering section, a low noise amplifier, an intermediate frequency (IF) stage, and a demodulator. The antenna section receives RF signals and provides the received RF signals to a low noise amplifier. The low noise amplifier amplifies the received RF signals and provides them as amplified RF signals to the IF stage. The IF stage steps down the frequency of the RF signals of interest to an intermediate frequency or to base-band. The intermediate frequency signals or base-band signals are digitized and provided to the demodulator, which recaptures the data in accordance with the demodulation protocol.

A wireless device, e.g., a radio or a device that contains a radio, may participate in unidirectional directional wireless communications, such as receiving radio broadcast signals in accordance with the FM radio standard (such as 47 C.F.R. 73 Subpart B in the United States), HD-Radio standard, National Radio Systems Committee NRSC-5B In-band/on-channel Digital Radio Broadcasting Standard, and Digital Audio Broadcasting Standard.

Amplification of received signals is part the operation of a receiver and other electronic devices. Signal saturation of a circuit component such as an amplifier may result and cause signal distortion and degradation if the amplification is too high. Similarly, if the amplification of a received signal is too low, the weak received signals may be cut off and the corresponding information in the cut off portion of the received signal will be lost. It is desirable to have optimized amplification of received signals for wireless devices receiving signals in accordance with different communication standards.

Multi-stage control described in this document can be implemented in circuits, such as RF receivers and transceivers in radio and wireless communication devices, where two or more amplification stages are provided to achieve desired signal amplification prior to digital processing and extracting data in the received signal. Within each amplification stage of signal amplification, the gain can be controlled to maintain the signal amplitude above a minimum signal level for improving the signal to noise ratio without reaching a high level that undesirably saturates the gain of the amplification stage. Beyond each individual amplification stage, the signal amplification of different amplification stages can be coordinated based on proper selection of gain settings in different amplification stages.

In implementations that are illustrated in examples in this document, a gain control circuit can be coupled to the amplification stages to provide the gain control at each individual amplification stage based on information that is fed to the control circuit from each amplification stage and to provide coordination between different application stages. In one implementation, for example, a circuit for such multi-stage gain control can include an input port that receives an input signal and two or more amplification stages coupled to the input port to receive the input signal and to produce an amplified output signal. The amplification stages are connected to one another to direct a signal output from one of the amplification stages into a subsequent amplification stage which amplifies the received signal to output an amplified signal. Each amplification stage can include an amplifier that is adjustable in gain under the control of the control circuit and a signal detector that measures an output signal of the amplifier to produce a detector signal indicative of a signal strength of the output signal of the amplifier. This detector signal is fed to the gain control circuit. The gain control circuit is coupled to receive detector signals from the signal detectors in the amplification stages, respectively, and controls gains of the amplifiers of the amplification stages based on respective received detector signals, respectively. The gain control circuit is configured to maintain the signal strength of each signal output from an amplification stage to be within a desired range and below a level that saturates a respective amplifier.

The present multi-stage gain control can be implemented in various configurations for a range of circuits that can benefit from the multi-stage signal amplification. For example, various radio receivers and wireless communication devices include multiple signal amplification stages to achieve the signal strength and desired signal-to-noise ratio or signal quality. Radio receivers can be configured to operate at multiple radio frequency bands and under different radio standards. Some examples of different radio technology standards include a frequency modulation (FM) radio standard, a high definition (HD) radio standard, National Radio Systems Committee NRSC-5B In-band/on-channel Digital Radio Broadcasting Standard, or Digital Audio Broadcasting (DAB) Standard. These different radio standards generally are at different radio frequency bands and have different technical specifications. A single radio receiver that is designed to operate under two or more different radio standards ("modes") needs to have the frequency tenability to operate at the respective different radio frequency bands and built-in circuitry mechanisms for adjusting gains and other radio receiving parameters under different radio standards or modes. The multi-stage gain control described in this document can be implemented to provide the desired gain control at each amplification stage and across different amplification stages to meet the requirements for operations under different radio standards in a single radio receiver. The signal detector in each amplification stage monitors the signal strength at each amplification stage and provides the local intelligence for the multi-stage gain control. The single radio receiver can use the gain control circuit to automatically adjust the gain settings when changing from one radio standard to a different standard.

In various wireless communication devices, the multi-stage gain control described in this document can be implemented to provide the desired gain control at each amplification stage and across different amplification stages to meet the requirements for operations under different and changing wireless environments for receiving RF communications.

FIG. 1 shows an example of a communication system 100 that includes an antenna 102 within a network or a radio device such as a radio transceiver or radio transmitter and a wireless communication device 150 in radio communication with the antenna 102. In one implementation, the antenna 102 can be part of a base station for a cellular telephone and data network. In another implementation, the antenna 102 can be part of an access point for an in-home or in-building wireless network. In another implementation, the antenna 102 can be part of a transmitter that transmits FM, HD-Radio, or DAB signals to radio receivers such as the wireless communication device 150. In yet another implementation, the antenna 102 can be part of a transmitter of another wireless communication device that can communicate with the wireless communication device 150.

In the specific example in FIG. 1, the wireless communication device 150 is a radio transceiver device that includes a digital signal processor 160 such as a CPU, a volatile memory 162 and a non-volatile memory 164 associated with operations of the processor 160, a receiver 170 for receiving radio signals, and a transmitter 180 for transmitting radio signals. The CPU 160 may be configured with instructions executable by the CPU. The executable instructions may be stored in volatile memory 162 within the wireless communication device 150, or non-volatile memory 164, such as a read-only memory (ROM), EEPROM (Electrically Erasable and Programmable Read Only Memory), or E-flash (embedded flash) within the receiver 150. The executable instructions that configure the CPU 160 may implement a number of software modules or applications that communicate with one another and with hardware and software inside and outside of the host 150, in order to implement the functions of a wireless communication device 150. For example, the CPU 160 may configure and receive data from the receiver 170 and may configure and send data to transmitter 180 for transmission. In some implementations, the wireless communication device 150 can incorporate functionality found in the BCM4330 IEEE 802.11a/b/g/n MAC/Baseband/Radio with Integrated Bluetooth 4.0+HS and FM Transceiver, available from Broadcom Corporation in Irvine, Calif., United States of America. Notably, the receiver 170 includes two or more signal amplification stages and each amplification stage includes a signal detector that measures the signal strength output by the stage. A saturation detector, for example, can be used to monitor whether the amplifier in each amplification stage is operated within a desired range without being saturated since saturation distorts and degrades the received signal.

While the wireless communication device 150 shown in FIG. 1 is a transceiver, in another embodiment, the wireless communication device 150 may be configured to include only a receiver 170 without having a transmitter 180. Such a device may be utilized in unidirectional communication systems where a wireless communication device 150 receives communications from the antenna 102.

Figure 2:
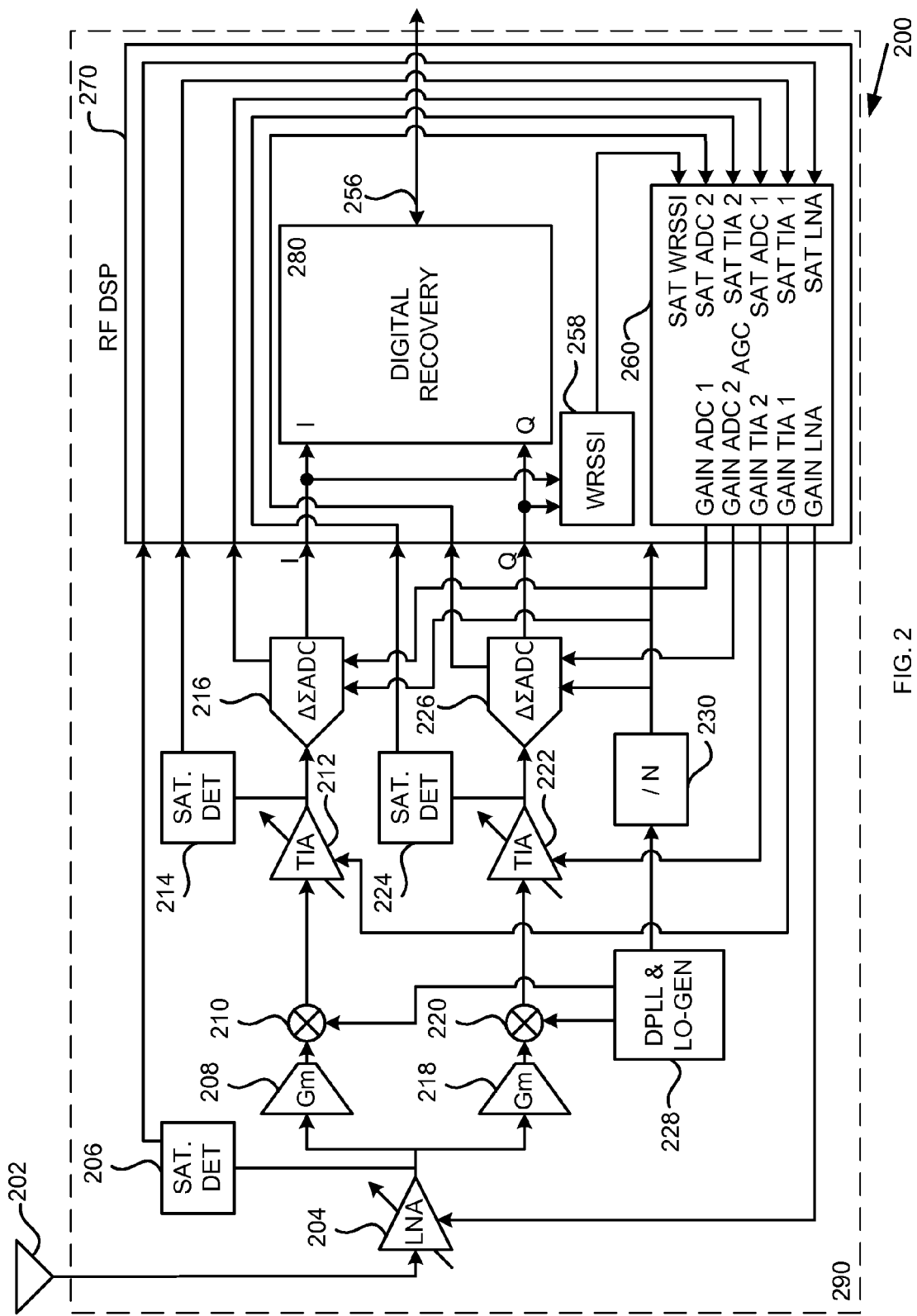
FIG. 2 is a diagram illustrating an exemplary receiver incorporating a multi-stage gain control.

FIG. 2 is a diagram illustrating an exemplary receiver 200 incorporating a multi-stage gain control. The receiver 200 may be utilized in the wireless communication device 150 of FIG. 1, such as the receiver 170 of FIG. 1. The receiver 200 includes an input port that receives an inbound radio frequency (RF) signal via the antenna 202. The inbound RF signal may be originated or transmitted by a base station, access point, or another wireless communication device. In one embodiment, the antenna 202 is an external antenna coupled to the remaining circuitry 290 of the receiver 200 of FIG. 2. For example, the circuitry 290 shown in FIG. 2 is implemented in an integrated circuit or printed circuit board, and the antenna is an external antenna coupled to the integrated circuit or printed circuit board. In another embodiment, the antenna 202 is implemented on the same integrated circuit or printed circuit board as the remaining circuitry 290 of the receiver 200.

The received RF signal is amplified by a variable gain low-noise amplifier (LNA) 204 to a level acceptable for processing in subsequent stages of the receiver. The amplified RF signal is converted to voltage signals using voltage-to-current converters 208 and 218. In one embodiment, the low-noise amplifier 204 and voltage to current converters 208 and 218 can be integrated into a single module, where the output of the combined module is provided to first and second mixers 210 and 220.

The voltage outputs of the voltage-to-current converters 208 and 218 are provided to the first and second mixers 210 and 220. The first mixer 210 mixes an in-phase component of the received, amplified RF signal with an in-phase component (I) of the receiver local oscillator 228. The second mixer 220 mixes a quadrature component (Q) of the received, amplified RF signal with a quadrature component of the receiver local oscillator 228.

The receiver local oscillator 228 can be a digital phase-locked loop (DPLL) local frequency synthesizer, and provides two phase-shifted local oscillator reference RF signals (e.g., 90-degree phase shifted cosine and sine signals) to the first and second mixers 210 and 220 that produce in-phase (I) and quadrature (Q) signals. The receiver local oscillator 228 also provides the basic clock signals for other parts of the receiver 200. For example, a divider module 230 is provided to divide the clock output of the receiver local oscillator 228 by a programmable integer amount, N, for use in analog-to-digital converters (ADCs) 216 and 226 and an RF digital signal processing (DSP) block 270 downstream from the ADCs 216 and 226. Within the RF DSP 270, the clock signal from the divider 230 is used at various parts within the RF DSP 270 at either the same clock rate of the output of the divider 230 or at one or more lower clock rates.

The mixed I and Q signals output from the first and second mixers 210 and 220 are amplified by tunable trans-impedance amplifiers 212 and 222, and are then converted from analog-to-digital via analog-to-digital converters 216 and 226. In some implementations, the analog-to-digital converters 216 and 226 can be implemented by sigma-delta ADC converters. In some implementations, the analog-to-digital converters 216 and 226 may amplify the signals before conversion to digital signals and thus provide another stage of signal amplification in the receiver 200 in addition to the signal amplification by the amplifiers 204, 212 and 222.

The RF DSP 270 is the digital portion of the receiver 200 and may be referred to as the baseband DSP of the receiver 200. In an example where the receiver 200 is a radio receiver, the RF DSP 270 can process the outputs from the ADCs 216 and 226 to generate the audio signal for the radio receiver. In FIG. 2, the RF DSP 270 includes a digital recovery module 280 that combines the in-phase sequence of data (I) and the quadrature phase sequence of data (Q), which are outputs of analog-to-digital converters 216 and 226, to provide the recovered sequence of data 256 after compensating for imbalances. The digital recovery module 280 can, for example, decode, descramble, constellation demap, and/or demodulate the digital reception formatted data output from analog-to-digital converters 216 and 226 to recover data 256 in accordance with the particular wireless communication standard being received at the antenna 202. More specifically, the in-phase sequence of data and the quadrature phase sequence of data may represent imbalanced sequences as a result of I/Q imbalances. The digital recovery module 280 may determine the sequence parameter values corresponding to the sequence parameters by observing the one or more observational interferers and/or the images of the one or more observational interferers embedded with the in-phase sequence of data and/or the quadrature phase sequence of data to allow for real-time adjustment of the sequence parameter values to compensate for the I/Q imbalances before demodulation and recovery of the sequence of data 256. The extracted data sequence of digital data 256 may be provided to another part of the RF DSP 270 or the digital signal processor 160 (e.g., a CPU) of FIG. 1.

The digital portion 270 of the receiver 200 may be implemented in hardware, software (including firmware), or a combination of hardware and software to perform the specified functionality. For example, in some implementations, the digital portion 270 may include a processor configured with processor-executable instructions to implement the desired functionality.

The accurate and timely setting of the controls of the variable gain blocks such as the low noise amplifier 204, the transimpedance amplifiers (TNA) 212 and 222, and the amplifiers in the analog-to-digital converters 216 and 226, is important to the operation of the receiver 200. Specifically, the variable gain of these amplifiers 204, 212, and 222, and the amplifiers in analog-to-digital converters 216 and 226, may be based on a number of factors, such as the RF signal received at the antenna 202. If the gain controls are not properly set, the receiver may suffer from reduced sensitivity (gain set too low) or may malfunction due to node saturation (gain set too high).

To avoid this, a saturation detector 206 determines whether the amplified received RF signal is substantially large in amplitude but not too large to cause undesired saturation. If the amplified received RF signal is substantially large in amplitude, the gain of the low-noise amplifier 204 is reduced to avoid saturation of the amplified received RF signal. The saturation detector 206 may also determine if the amplitude of the amplified signal is too low. If so, the gain of the low-noise amplifier 204 is increased.

Similarly, the above saturation detection can be implemented in the subsequent stage of signal amplification. Saturation detectors 214 and 224 are coupled at the outputs of the TNA amplifiers 212 and 22 and determine whether outputs of the transimpedance amplifiers 212 and 222 are substantially large in amplitude. If the amplified output of the transimpedance amplifiers 212 and 222 is substantially large in amplitude, the gain of the transimpedance amplifiers 212 and 222 is reduced. The saturation detectors 214 and 224 also determine whether outputs of the transimpedance amplifiers 212 and 222 are too small in amplitude. If outputs of the transimpedance amplifiers 212 and 222 are too small in amplitude, the gain of the transimpedance amplifiers 212 and 222 is increased.

In the example in FIG. 2, the RF DSP 270 is configured to determine the Wideband Received Signal Strength Indication (WRSSI) by digitally calculating a magnitude of a signal, e.g., a received RF signal or representation thereof, such as an UQ signal pair input to the digital portion 270 of the receiver 200. The WRSSI can be determined by a WRSSI module 258 that is coupled to receive the I and Q signals from the DACs 216 and 226 and to perform the WRSSI processing. The signal magnitudes of the UQ signal pair may be used to optimally adjust the gain of an amplifier in the analog-to-digital converters 216 and 226. For example, the WRSSI module 258 filters the magnitude of the UQ signal pair to produce a filtered magnitude signal. The process then continues by determining a coarse Received Signal Strength Indication (RSSI) value of the filtered magnitude signal, wherein the coarse RSSI value indicates a sliding window of RSSI values. Once the coarse RSSI value is obtained, the process continues by determining a fine RSSI value within the sliding window of RSSI values. In another example, the digital calculation of an RSSI value begins by digitally calculating a magnitude signal from digital UQ signals. The process continues by determining a range of WRSSI values from the magnitude signal. The process concludes by determining whether the WRSSI value is within the range of WRSSI values.

Thus, in the signal path of the received signal from the antenna 202 to the digital portion 270 of the receiver 200 of FIG. 2, there are three stages of amplification under control of an automatic gain control (AGC) circuit or module 260. The first amplification stage includes a first-stage amplifier, the LNA 204, under a control of the AGC circuit 260 to amplify the input signal and a first stage saturation detector, the saturation detector 206, coupled at an output of the LNA 204 to produce a detector signal that is received by the AGC circuit 260. The output of the LNA 204 is split into two signals along two circuit paths. The first circuit path receives a first portion of the amplified output signal of the LNA 204 and includes a first mixer 210 that mixes the first portion with a first local oscillator signal from the DPLL 228 to produce a first signal, a first second-stage amplifier TIA 212 that amplifies the first signal, a first second-stage saturation detector 214 coupled to an output of the first second stage amplifier to produce a detector signal that is received by the gain control circuit 260, and a first analog to digital converter 216 that converts the first signal output from the first second-stage amplifier into a first digital signal. The second circuit path receives a second portion of the amplified output signal of the LNA 204 and includes a second mixer 220 that mixes the second portion with a second local oscillator signal from the DPLL 228 to produce a second signal, a second second-stage amplifier TIA 222 that amplifies the second signal, a second second-stage saturation detector 224 coupled to an output of the second second-stage amplifier to produce a detector signal that is received by the gain control circuit 260, and a first analog to digital converter 226 that converts the first signal output from the second second-stage amplifier into a second digital signal. The third amplification stage is in the analog to digital converters 216 and 226 which include amplifiers under control by the AGC circuit 260. Coordination of the selection of gain settings in each amplification stage may optimally set the amplification of each amplification stage while avoiding saturation of the received signal at a given node.

The automatic gain control (AGC) module 260 is shown in FIG. 2 as part of the RF DSP 270 to provide the multi-stage gain control based on the indications from the saturation detectors 206, 214 and 224 and the WRSSI module 258. The AGC module 260 receives information from saturation detectors 206, 214, and 224, and the WRSSI module 258, and utilizes the information to control the gain of each of variable gain amplifiers 204, 212, and 222, and the amplification gain in the analog-to-digital converters 216 and 226. The resulting gain settings allow the receiver 200 to operate optimally, for example, by avoiding reduced sensitivity or saturation at any node in the receiver 200. The AGC module 260 may incorporate feedback control to ensure that the setting of the gain controls occurs in a timely manner Proper operation of the AGC module 260 depends upon the availability of an accurate and relatively instantaneous indication of the strength of the signal after each amplification state, as detected by the saturation detectors 206, 214, and 224, and the WRSSI module 258.

Figure 3A:
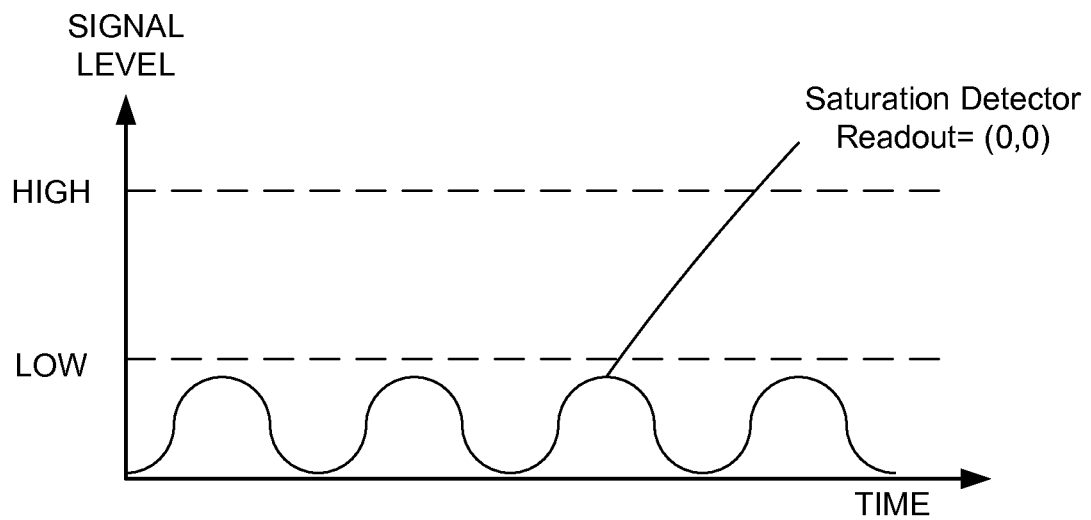
FIG. 3A is a diagram illustrating an exemplary signal evaluated by a saturation detector or wideband received signal strength indicator.
Figure 3B:
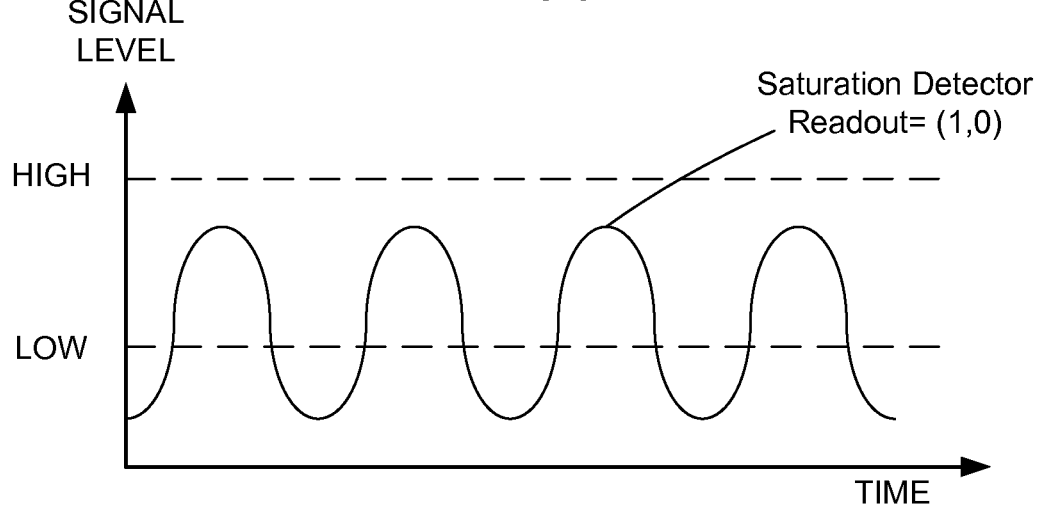
FIG. 3B is a diagram illustrating an exemplary signal evaluated by a saturation detector or wideband received signal strength indicator.
Figure 3C:
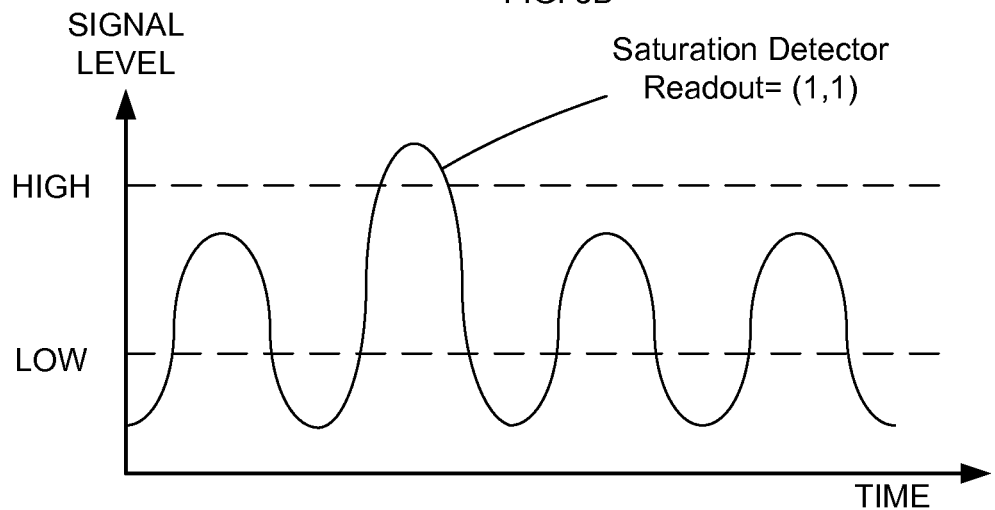
FIG. 3C is a diagram illustrating an exemplary signal evaluated by a saturation detector or wideband received signal strength indicator.

FIGS. 3A-3C illustrate signal magnitude scenarios that may be observed at saturation detectors 206, 214, and 224, and the WRSSI module 258. FIG. 3A is a diagram illustrating an exemplary signal evaluated by a saturation detector 206, 214 and 224, or WRSSI module 258. The signal shown in FIG. 3A is less than a maximum threshold ("HIGH") set for the amplification stage and less than a minimum threshold ("LOW") set for the amplification stage. The saturation detectors 206, 214 and 224, or WRSSI module 258 may indicate this by outputting a two-bit output signal indicating the relative strength of the signal with respect to the two thresholds. In FIG. 3A, the signal amplitude is beneath the minimum and maximum thresholds ({LOW, HIGH}={0,0}). In this example, the gain of a preceding amplification block upstream to the location of the a saturation detector or the WRSSI can be increased. For example, if the signal amplitude in FIG. 3A is the readout of the saturation detector 224 located between the TIA 222 and the ADC 226, the AGC module 260 may operate to adjust the gain of the TIA 222 to boost the signal amplitude above the minimum threshold LOW so that the two-bit signal is adjusted to be {1, 0}.

FIG. 3B is a diagram illustrating an exemplary signal evaluated by a saturation detector 206, 214 and 224, or WRSSI module 258. The signal shown in FIG. 3B is less than the maximum threshold ("HIGH") but greater than the minimum threshold ("LOW"). The saturation detectors 206, 214 and 224, or WRSSI module 258 may indicate this by outputting a two-bit output signal indicating that the signal amplitude is above the minimum and below the maximum thresholds ({LOW, HIGH}={1,0}). In this example, the gain of a preceding amplification block, e.g., the TIA 222, may be left unchanged when the output of the saturation detector 224 is {1,0}.

FIG. 3C is a diagram illustrating an exemplary signal evaluated by a saturation detector 206, 214 and 224, or WRSSI module 258 where the signal amplitude at one point of time coinciding with the second peak is greater than a maximum threshold ("HIGH") and greater than a minimum threshold ("LOW"). The saturation detectors 206, 214 and 224, or WRSSI module 258 may indicate this by outputting a two-bit output signal indicating that the signal amplitude is above both the minimum and maximum thresholds GLOW, HIGH}={1, 1}). In this example, the gain of a preceding amplification block should be decreased to change the two-bit signal to {1, 0}.

Thus, in view of FIGS. 3A-3C, the magnitude of the signal at a particular node in the receiver 200 may be optimally controlled in order to be greater than a minimum threshold and less than a maximum threshold. In some implementations, the minimum and maximum thresholds can be fixed values for a respective node. In other implementations, the minimum and maximum thresholds at a particular node can be configurable values and thus can be adjusted. The type of signal magnitude utilized may also differ. In one embodiment, the signal magnitude is an analog magnitude. In another embodiment, the signal magnitude is a digital magnitude. Depending on the embodiment, the magnitude may be an instantaneous peak value, an average peak value, an average root-mean-squared value, or other useful measure of signal strength.

Referring back to FIG. 2, the receiver 200 of FIG. 2 may be capable of receiving signals at different frequencies of operation, different bandwidths, and different signal strengths, for example, which may occur when receiving FM, HD-Radio, and DAB signals. Flexible selection of gain settings in each amplification stage of the receiver 200 of FIG. 2 may optimally set the amplification of each amplification stage while avoiding saturation of the received signal at a given node, allowing the receiver 200 to be configured to receive signals of different standards and with different attributes.

The saturation detectors 206, 214 and 224 and the WRSSI module 258 in FIG. 2 provide local detection for the AGC module 260 to control the respective amplifiers in different amplification stages. In addition, depending on the operation status of each amplifier, the AGC module 260 can control another amplification stage to achieve a desired over all gain control across different amplification stages.

For example, consider operations of the multi-stage gain control with two amplification stages in a radio receiver. The multi-stage gain control can include amplifying a signal by a first gain factor in a first amplification stage to produce a first amplified signal, amplifying the first amplified signal by a second gain factor in a second amplification stage to produce a second amplified signal; reducing the second gain factor when a magnitude of the second amplified signal exceeds a maximum threshold; and reducing the first gain factor when the magnitude of the second amplified signal exceeds a maximum threshold and the second gain factor corresponds to a minimum gain factor for the second amplification stage.

One example for a circuit for receiving a wireless signal based on a multi-stage control design can include a first amplification stage operable to amplify the received wireless signal by a first gain factor to produce a first amplified signal; a first detector operable to monitor the first amplified signal and provide an first indication signal when the first amplified signal is outside a first specified amplitude range; a second amplification stage operable to amplify the first amplified signal by a second gain factor to produce a second amplified signal; a second detector operable to monitor the second amplified signal and provide an second indication signal when the second amplified signal is outside a second specified amplitude range; and a gain control circuit coupled to the first and second amplification stages. The gain control circuit is operable to receive the first indication signal and configure the first gain factor in response to the first indication signal. When the first indication signal indicates the magnitude of the first amplified signal is within the first specified amplitude range, the gain control circuit receives the second indication signal and increases the second gain factor when the second indication signal indicates that a magnitude of the second amplified signal is less than the second specified amplitude range. The gain control circuit reduces the second gain factor when a magnitude of the second amplified signal is greater than the second specified amplitude range, and also reduces the first gain factor when the magnitude of the second amplified signal is greater than the second specified amplitude range and the second gain factor corresponds to a minimum gain factor for the second amplification stage.

Figure 4:
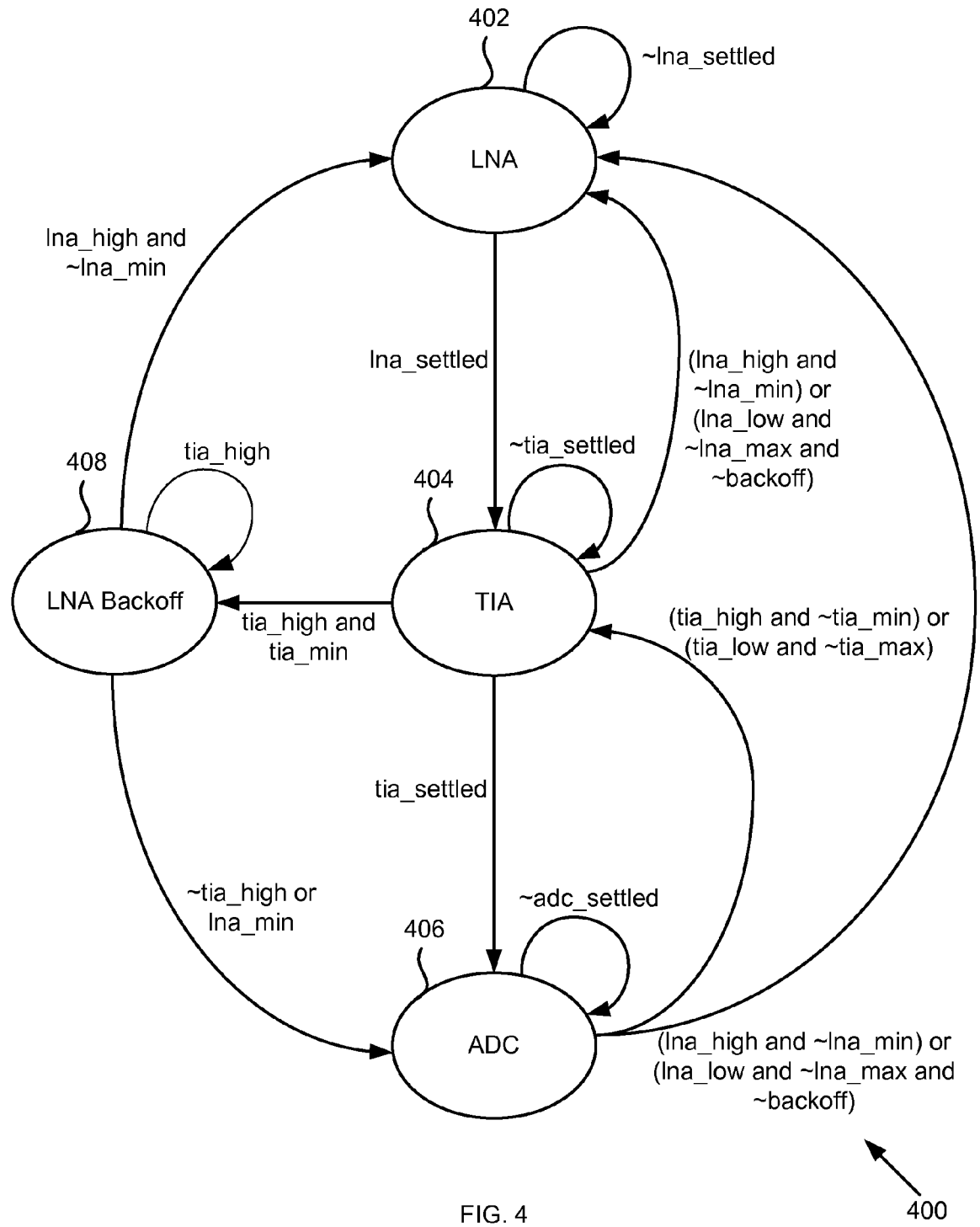
FIG. 4 is a diagram illustrating the state transitions of an exemplary automatic gain control module.

FIG. 4 is a diagram illustrating the state transitions of an exemplary automatic gain control (AGC) module 260 in FIG. 2 under one implementation of a state machine 400 for operating the AGC module 260. As explained in further detail below, in some implementations, the state machine 400 can be designed to enable the AGC module 260 to adjust the gain of the amplification stage closest to the signal input, then to adjust the gain of each succeeding amplification stage until the gains of all amplification stages are adjusted to achieve a desired state. When adjusting the gain of a succeeding amplification stage, the state machine 400 can go back to re-adjust the gain of a preceding amplification stage if signal saturation, or low signal magnitude, is subsequently detected in a preceding stage.

Referring to FIG. 4, control begins at state 402, where the gain of the variable gain low-noise amplifier (LNA) 204 is adjusted. The saturation detector 206 can be coupled at the output of the LNA 204 to measure or evaluate the output of the low-noise amplifier 204. The saturation detector 206 may indicate that the signal magnitude is too low ({LOW, HIGH}={0,0}), too high ({LOW, HIGH}={1,1}), or within an acceptable range (lna_settled=1, {LOW, HIGH}={1,0}).

If the signal magnitude is too low, the gain of the low-noise amplifier 204 is increased by a programmable gain amount. If the signal magnitude is too high, the gain of the low-noise amplifier 204 is decreased by a programmable gain amount. In one embodiment, if the signal magnitude is within an acceptable range, the gain may still be increased in order to achieve a signal magnitude toward the maximum threshold. Once a gain adjustment is made, a programmable period of time may elapse before the low-noise amplifier output 204 is evaluated again. The low-noise amplifier 204 gain adjustment is repeated until a signal (lna_settled=1) indicates the magnitude of output of the low-noise amplifier is greater than a minimum threshold but less than a maximum threshold, as shown in FIG. 3B. If the gain of the low-noise amplifier 204 has been successfully adjusted to achieve an output greater than a minimum threshold but less than a maximum threshold, control passes to state 404 in order to adjust the next amplification stage.

At state 404, the gain of the trans-impedance amplifiers (TIAs) 212 and 222 is adjusted by the automatic gain control module 260 based on the signal amplitude of the TIAs 212 and 222. In one embodiment, the same gain setting is utilized for both trans-impedance amplifiers 212 and 222, and the minimum threshold signals and maximum threshold signals of the saturation detectors 214 and 224 are logically combined through a logic-OR function to create a single maximum threshold signal and a single minimum threshold signal.

The saturation detectors 214 and 224 can be coupled to the output terminals of to measure or evaluate the outputs of the trans-impedance amplifiers (TIAs) 212 and 222. The combined outputs of saturation detectors 214 and 224 may indicate that the magnitude of at least one of the transimpedance amplifier outputs is too low ({LOW, HIGH}={0,0}) or too high ({LOW, HIGH}={1,1}). If the magnitude of both the trans-impedance amplifier outputs is within an acceptable range (tia_settled=1, {LOW, HIGH}={1,0}), control passes to state 406 in order to adjust the amplification within the analog-to-digital converters 216 and 226.

At state 406, the gain of the analog-to-digital converters (ADCs) 216 and 226 is adjusted by the automatic gain control module 260. The Wideband Received Signal Strength Indicator module 258 evaluates the signal strength of the digitized in-phase and quadrature signals that are outputs of the analog-to-digital converters (ADCs) 216 and 226. The signal strength indication is provided to the automatic gain control module 260 in order to adjust the gain of the analog-to-digital converters 216 and 226. In one embodiment, the same gain setting is utilized for both analog-to-digital converters 216 and 226 to reduce control and wiring resources. In another embodiment, shown in FIG. 2, separate control signals are used to control the gain settings of the analog-to-digital converters (ADCs) 216 and 226, which may permit separate adjustment of the gain of the in-phase and quadrature signals.

At state 406, the automatic gain control module 260 evaluates the signal strength indication provided by the Wideband Received Signal Strength Indicator module 258. If the strength of the digitized in-phase and quadrature signals is too low, such as shown in FIG. 3A, then the state machine input adc_settled is equal to 0 and the automatic gain control module 260 increases the gain of the analog-to-digital converters 216 and 226. If the strength of the digitized in-phase and quadrature signals is too high, such as shown in FIG. 3C, then the state machine input adc_settled is equal to 0 and the automatic gain control module 260 decreases the gain of the analog-to-digital converters 216 and 226. If the strength of the digitized in-phase and quadrature signals is within an acceptable range, such as shown in FIG. 3B, then adc_settled is equal to 1 and the gain stages of the receiver 200 are left unchanged and are maintained at their existing gain settings.

While the state transitions from state 402 to state 404, and from state 404 to state 406 describe one sequence of adjusting the gain of successive amplification states in the receiver 200, other state transitions account for changes over time of the received signal that may require the gain of one or more of the gain stages of the receiver 200 to be adjusted again.

For example, the minimum or maximum gain of a particular gain stage may be reached while the signal output at the stage is still outside the acceptable range. Under this condition, another amplification stage can be adjusted to rectify the condition. For example, the output of a gain stage may look like the signal of FIG. 3A even though the amplification of that stage has been maximized. As such, the gain of the preceding stage can be increased in order to bring the amplitude of the signal to within an acceptable range as shown in FIG. 3B. In another example, the output of a gain stage may look like the signal of FIG. 3C even though the amplification of that stage has been minimized In that case, the gain of the preceding stage is reduced in order to bring the amplitude of the signal to within an acceptable range as shown in FIG. 3B.

When the automatic gain control 260 is in state 406, adc_settled may transition from 1 back to 0, indicating that the strength of the digitized in-phase and quadrature signals has deviated from an acceptable range, such as FIG. 3B, to an unacceptable range, such as shown in FIG. 3A or FIG. 3C. In this case, the state 406 remains the same, but the gain of the analog-to-digital converters (ADCs) 216 and 226 can be increased or decreased as previously described above to restore the magnitude of the digitized in-phase and quadrature signals to the acceptable range shown in FIG. 3B, at which time the adc_settled signal utilized in the state machine transitions from 0 back to 1. In this way, the automatic gain control module 260 may continually, periodically, or intermittently adjust the gain of the analog-to-digital converters (ADCs) 216 and 226 as needed to maintain the signal strength within an acceptable range.

A transition from state 406 to state 402 or state 404 may be made if the signal amplitude as monitored by saturation detectors at the output of a prior amplification stage falls outside of an acceptable range.

For example, a transition from state 406, where the gain of the analog-to-digital converters 216 and 226 is adjusted, to state 404, where the gain of the trans-impedance amplifiers 212 and 222 is adjusted, if the saturation detectors 214, and 224 indicate to the automatic gain control module 260 that amplitude of the output of the trans-impedance amplifiers 212 and 222 is too high (tia_high=1) or too low (tia_low=0) and the gain of the trans-impedance amplifiers 212 and 222 can be adjusted to correct the condition. If tia_high=1, control returns to state 404 if the gain of the trans-impedance amplifiers 212 and 222 can be reduced (tia_min=1). While not shown in FIG. 4, if the gain of the trans-impedance amplifiers 212 and 222 is already at a minimum (tia_min=1), control may return to state 402 instead to decrease the gain of the prior amplification stage, LNA amplifier 204. If tia_low=1, control returns to state 404 only if the gain of the trans-impedance amplifiers 212 and 222 can be increased (tia_max=0). While not shown in FIG. 4, if the gain of the trans-impedance amplifiers 212 and 222 is already at a maximum (tia_max=1), control returns to state 402 instead to increase the gain of the prior amplification stage, LNA amplification stage 204.

A transition from state 406 to state 402 may be made if the signal amplitude as monitored by saturation detectors at the output of the low-noise amplifier 204 falls outside of an acceptable range. For example, a transition from state 406, where the gain of the analog-to-digital converters 216 and 226 is adjusted, to state 402, where the gain of the low-noise amplifier 204 is adjusted, if the saturation detector 206 indicates to the automatic gain control module 260 that the amplitude of the output of the low-noise amplifier 204 is too high (lna_high=1) or too low (lna_low=0) and the gain of the low-noise amplifier 204 can be adjusted to correct the condition. If lna_high=1, control returns to state 402 if the gain of the low-noise amplifier 204 can be reduced (lna_min=1). In one embodiment shown in FIG. 4, this transition occurs only if an enable signal is disabled as well (backoff=0). If lna_low=1, control returns to state 402 if the gain of the low-noise amplifier 204 can be increased (lna_max=0).

Returning to state 404, other conditions are evaluated while adjusting the gain of the trans-impedance amplifiers 212 and 222 before a decision is made to transition to state 406 to adjust the gain of the analog-to-digital converters (ADCs) 216 and 226. For example, if the output of the trans-impedance amplifiers (TIAs) 212 and 222 cannot be adjusted to an acceptable range because the output of the trans-impedance amplifiers (TIAs) 212 and 222 is too high (tia_high=1) and the gain of the trans-impedance amplifiers (TIAs) is already at a minimum (tia_min=1), control passes from state 404 to state 408, where the amplification of the low-noise amplifier (LNA) 204 is reduced until the output of the trans-impedance amplifiers decreases to an acceptable range (as reflected by a transition of tia_high from 1 to zero). If this is achieved, or if the gain of the low-noise amplifier is minimized (lna_min=0), control passes to state 406. If the saturation detector 206 indicates to the automatic gain control module 260 that the amplitude of the output of the low-noise amplifier 204 is too high (lna_high=1) and the gain of the low-noise amplifier is not already minimized (lna_min=0), then control passes back to state 402 to re-configure the gain of the low-noise amplifier again.

Returning back to state 404, a transition from state 404 to state 402 may be required if the signal amplitude as monitored by saturation detectors at the output of the low-noise amplifier 204 falls outside of an acceptable range. For example, a transition from state 404, where the trans-impedance amplifiers 212 and 222 is adjusted, to state 402, where the gain of the low-noise amplifier 204 is adjusted, if the saturation detector 206 indicates to the automatic gain control module 260 that the amplitude of the output of the low-noise amplifier 204 is too high (lna_high=1) or too low (lna_low=1) and the gain of the low-noise amplifier 204 can be adjusted to correct the condition. If lna_high=1, control returns to state 402 if the gain of the low-noise amplifier 204 can be reduced (lna_min=0). In one embodiment shown in FIG. 4, this transition occurs only if an enable signal is disabled as well (backoff=0). If lna_low=1, control returns to state 402 if the gain of the low-noise amplifier 204 can be increased (lna_max=0).

While not shown in FIG. 4, a transition from state 406, where the gain of the analog-to-digital converters (ADCs) 216 and 226, to a state where the gain of prior amplification stages is reduced, may occur if it is detected that the digitized output of the analog-to-digital converters (ADCs) 216 and 226 is too high (adc_high=1) while the gain of the amplification in the analog-to-digital converters (ADCs) 216 and 226 is already minimized (adc_min=1).

The state machine 400 may be implemented in hardware, software, or a combination of hardware and software. In one embodiment, the state machine is implemented using instructions executable by a processor inside the receiver 200 or a processor outside the receiver 200, e.g., the processor 160 of FIG. 1.

The receiver 200 of FIG. 2 can be configured for various receiver operations, including receiving FM, HD-Radio, and DAB signals, and receiving other communication signals including both wireless or wired communication signals. The automatic gain control 260 for controlling the gain of a multi-stage amplification signal chain with two or more amplification stages is described with specific reference to a receiver in a communication device and can also be applied to a multi-stage amplification circuit in devices other than communication receivers.

Figure 5:
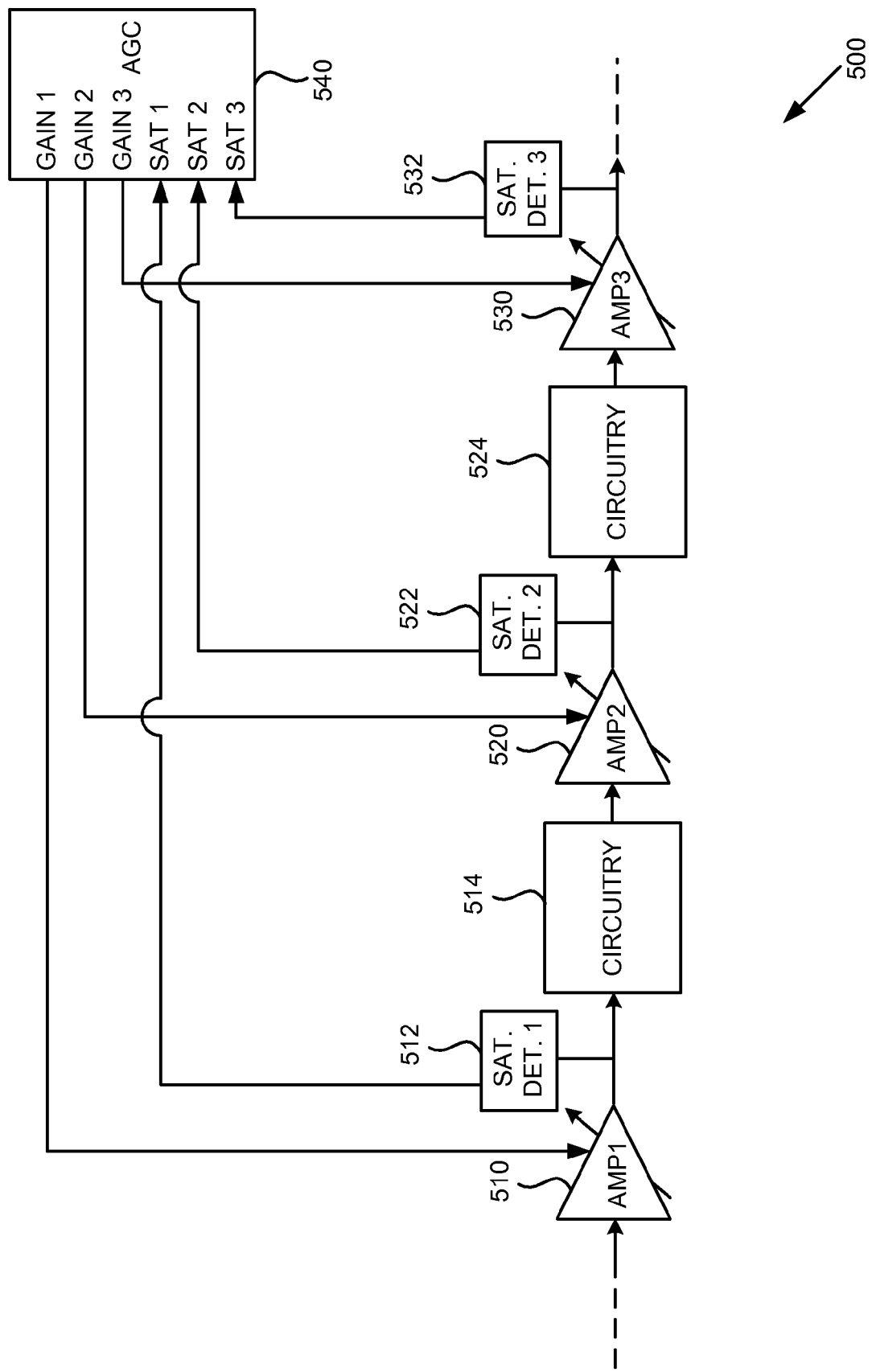
FIG. 5 is a diagram illustrating an exemplary multi-stage gain control.

FIG. 5 is a diagram illustrating an exemplary multi-stage gain control having multiple amplification stages AMP1, AMP2, AMP3 in series and respective saturation detectors at different amplification stages. The first amplification stage includes an amplifier 510 and a saturation detector 512 which may determine if the output of an amplifier is within an acceptable range, or is less than a maximum threshold. Circuitry 514 may electrically couple the first amplification stage to the second amplification stage, which includes an amplifier 520 and a saturation detector 522. Circuitry 524 may electrically couple the second amplification stage to the third amplification stage, which includes an amplifier 530 and a saturation detector 532. Automatic gain control 540 may monitor the outputs of the saturation detectors 512, 522, and 532 and adjust the gain of amplifiers 510, 520, and 530 to maintain the output of each amplifier amplifiers 510, 520, and 530 beneath configurable thresholds or within configurable ranges. In one embodiment, the maximum thresholds or amplitude ranges of each saturation detectors 512, 522, and 532 may be separately configured. In one embodiment, the automatic gain control 540 and the threshold settings of the saturation detectors 512, 522, and 532 may be configured to permit the signal amplitude of each amplifier output to be maximized (within a range or below a threshold) at each stage, which may minimize the effects of noise amplification in each successive amplification stage. In other embodiment, the automatic gain control 540 and the threshold settings saturation detectors 512, 522, and 532 may be configured so that each amplifier 510, 520, and 530 is configured in its linear region of operation, or so that overall gain of the circuitry 500 is achieved by using the same or similar amplification (gain settings) at each amplification stage.

A few embodiments have been described in detail above, and various modifications are possible. The disclosed subject matter, including the functional operations described in this document, can be implemented in electronic circuitry, computer hardware, firmware, software, or in combinations of them, such as the structural means disclosed in this document and structural equivalents thereof, including potentially a program operable to cause one or more data processing apparatus to perform the operations described (such as a program encoded in a computer-readable medium, which is a non-transitory medium which retains information recorded therein. Examples of such media include, e.g., a memory device, a storage device, a machine-readable storage substrate, or other physical, machine-readable medium, or a combination of one or more of them).

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A program (also known as a computer program, software, software application, script, or code) can be written in any form of programming language, including compiled or interpreted languages, or declarative or procedural languages, and it can be deployed in any form, including as a stand alone program or as a module, component, subroutine, or other unit suitable for use in a computing environment. A program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A program can be deployed to be executed on one computer or on multiple computers that are located at one site or distributed across multiple sites and interconnected by a communication network.

While this document contains many specifics, these should not be construed as limitations on the scope of any invention or of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments.

Only a few implementations and examples are described and other implementations, enhancements and variations can be made based on what is described and illustrated in this document.

What is claimed is:

1. Circuitry for amplifying an input signal, said circuitry comprising:
   a first amplification stage configured to receive said input signal and provide a first amplified output signal to a first signal detector to produce a first detector signal;
   a second amplification stage connected downstream of said first amplification stage and configured to provide a second amplified output signal to a second signal detector to produce a second detector signal;
   a third amplification stage, as part of an analog to digital converter, configured to amplify said second amplified output signal before conversion to a digitized third amplified output signal;
   a gain control circuit configured to receive said first and second detector signals and adjust a first gain factor of said first amplification stage and a second gain factor of said second amplification stage;
   a signal strength indicator module that receives the digitized third amplified output signal from the analog to digital converter and determines a received signal strength indication (RSSI) value corresponding to the digitized third amplified output signal;
   said gain control circuit configured to receive the digitized third amplified output signal and the RSSI value, and adjust a third gain factor of said third amplification stage based on said digitized third amplified output signal and the RSSI value; and
   a digital recovery module configured to adjust an in-phase sequence of data and a quadrature phase sequence of data to provide real-time adjustment of sequence parameter values,
   wherein said circuitry is configured to operate at multiple frequency bands.

2. The circuitry of claim 1, wherein said gain control circuit is configured to adjust said first gain factor and said second gain factor to avoid saturation in said first and second amplified output signals by reducing a gain in an associated amplifier detected by a saturation detector.

3. The circuitry of claim 1, wherein said gain control circuit is configured to adjust said first gain factor and said second gain factor to avoid signal cutoff in said first and second amplified output signals by increasing a gain in an associated amplifier detected by a saturation detector.

4. The circuitry of claim 1, wherein said gain control circuit is configured to receive said first and second detector signals to provide coordination between said first and second amplification stages to achieve an overall gain control.

5. The circuitry of claim 1, wherein said gain control circuit is configured to decrease said first gain factor when a magnitude of said first amplified output signal is above a signal saturation threshold.

6. The circuitry of claim 1, wherein said gain control circuit is configured to increase said first gain factor when a magnitude of said first amplified output signal is below a signal cutoff threshold.

7. The circuitry of claim 1, wherein said gain control circuit is configured to decrease said second gain factor when a magnitude of said second amplified output signal is above a signal saturation threshold.

8. The circuitry of claim 1, wherein said gain control circuit is configured to increase said second gain factor when a magnitude of said second amplified output signal is below a signal cutoff threshold.

9. The circuitry of claim 1, wherein said gain control circuit is configured to automatically adjust said first and second gain factors when said input signal changes from one radio technology standard to another radio technology standard.

10. The circuitry of claim 1, wherein the digital recovery module is further configured to compensate for inphase-to-quadrature ratio imbalances.

11. Receiver circuitry comprising:
   a first amplification stage configured to receive an input signal and provide a first amplified output signal to a first signal detector to produce a first detector signal;
   a second amplification stage connected downstream of said first amplification stage and configured to provide a second amplified output signal to a second signal detector to produce a second detector signal;
   an analog to digital converter circuit configured to amplify said second amplified output signal before converting said second amplified output to a digitized third amplified output signal;
   a digital signal processing circuit including a control circuit configured to receive said first and second detector signals and adjust a first gain factor of said first amplification stage and a second gain factor of said second amplification stage;
   a signal strength indicator module that receives the digitized third amplified output signal from the analog to digital converter circuit and determines a received signal strength indication (RSSI) value corresponding to the digitized third amplified output signal;
   said control circuit configured to receive the digitized third amplified output signal and the RSSI value, and adjust a third gain factor of said converter circuit based on said digitized third amplified output signal and the RSSI value, and to compensate for inphase-to-quadrature ratio imbalances;
   wherein said receiver circuitry is configured to operate at multiple frequency bands.

12. The receiver circuitry of claim 11, wherein said analog to digital converter circuit includes a third amplification stage configured to provide a third detector signal to said control circuit.

13. The receiver circuitry of claim 11, wherein said signal strength indicator module is configured to determine the RSSI value based on a filtered magnitude signal obtained from the digitized third amplified output signal.

14. The receiver circuitry of claim 11, wherein said control circuit is configured to adjust said first gain factor and said second gain factor to avoid signal saturation in said first and second amplified output signals detected by one or more saturation detectors in the first amplification stage and the second amplification stage.

15. The receiver circuitry of claim 11, wherein said gain control circuit is configured to adjust said first gain factor and said second gain factor to avoid signal cutoff in said first and second amplified output signals.

16. The receiver circuitry of claim 11, wherein said control circuit is configured to receive said first and second detector signals to provide coordination between said first and second amplification stages to achieve an overall gain control.

17. The receiver circuitry of claim 11, wherein said first amplification stage includes a low-noise amplifier (LNA) configured to receive said input signal and provide said first amplified signal, and said second amplification stage includes a trans-impedance amplifier (TIA) configured to produce said second amplified signal.

18. The receiver circuitry of claim 11, wherein said input signal is a radio signal based on one of different radio technology standards including frequency modulation (FM) radio standard, high definition (HD) radio standard, National Radio Systems Committee NRSC-5B In-band/on-Channel Digital Radio Broadcasting Standard, and Digital Audio Broadcasting Standard.

19. A method, implemented by circuitry, of amplifying a signal, said method comprising:
   amplifying said signal by a first gain factor in a first amplification stage to produce a first amplified signal;
   amplifying said first amplified signal by a second gain factor in a second amplification stage to produce a second amplified signal;
   amplifying said second amplified signal before converting, by an analog to digital converter, said second amplified signal in a third amplification stage to produce a digitized third amplified output signal;
   reducing said second gain factor when a magnitude of said second amplified signal exceeds a saturation threshold of said second amplified signal;
   reducing said first gain factor when said second gain factor can no longer be reduced;
   receiving the digitized third amplified output signal from the analog to digital converter and determining a received signal strength indication (RSSI) value corresponding to the digitized third amplified output signal;
   adjusting a third gain factor of said third amplification stage based on said digitized third amplified output signal and the RSSI value; and
   adjusting an inphase sequence of data and a quadrature phase sequence of data to provide real-time adjustment of sequence parameter values and compensate for inphase-to-quadrature ratio imbalances,
   wherein said circuitry is configured to operate at multiple frequency bands.

20. The method of claim 19, wherein said amplifying said signal comprises:
   increasing said first gain factor when a magnitude of said first amplified signal is below a cutoff threshold of said first amplified signal; and
   decreasing said first gain factor when said magnitude of said first amplified signal is above the saturation threshold of said first amplified signal.

21. The method of claim 19, wherein said amplifying said first amplified signal comprises:
   increasing said second gain factor when said magnitude of said second amplified signal is below a cutoff threshold of said second amplified signal; and
   decreasing said second gain factor when said magnitude of said second amplified signal is above said saturation threshold of said second amplified signal.

* * * * *